(12) United States Patent
Lee

(10) Patent No.: US 12,306,259 B2
(45) Date of Patent: May 20, 2025

(54) BATTERY MANAGEMENT SYSTEM, BATTERY MANAGEMENT METHOD, BATTERY PACK, AND ELECTRIC VEHICLE

(71) Applicant: LG ENERGY SOLUTION, LTD., Seoul (KR)

(72) Inventor: Bom-Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 248 days.

(21) Appl. No.: 17/766,922

(22) PCT Filed: Dec. 11, 2020

(86) PCT No.: PCT/KR2020/018204
§ 371 (c)(1),
(2) Date: Apr. 6, 2022

(87) PCT Pub. No.: WO2021/118311
PCT Pub. Date: Jun. 17, 2021

(65) Prior Publication Data
US 2024/0085486 A1    Mar. 14, 2024

(30) Foreign Application Priority Data
Dec. 11, 2019   (KR) ........................ 10-2019-0164891

(51) Int. Cl.
*H02J 7/00*     (2006.01)
*B60L 3/00*     (2019.01)
(Continued)

(52) U.S. Cl.
CPC .......... *G01R 31/392* (2019.01); *B60L 3/0046* (2013.01); *G01R 31/388* (2019.01);
(Continued)

(58) Field of Classification Search
USPC ........ 320/106, 107, 108, 130, 131, 132, 133
See application file for complete search history.

(56) References Cited

U.S. PATENT DOCUMENTS

| 7,009,401 B2 | 3/2006 | Kinoshita et al. |
| 2004/0076872 A1 | 4/2004 | Kinoshita et al. |

(Continued)

FOREIGN PATENT DOCUMENTS

| CN | 101226229 A | * | 7/2008 | ............... B60L 58/10 |
| CN | 102428379 A | * | 4/2012 | ......... G01R 31/3679 |

(Continued)

OTHER PUBLICATIONS

Extended European Search Report dated Nov. 3, 2022, issued by the European Patent Office in corresponding European Patent Application No. 20899360.0.

(Continued)

*Primary Examiner* — Brian Ngo
(74) *Attorney, Agent, or Firm* — Morgan, Lewis & Bockius LLP

(57) ABSTRACT

A battery management system includes a current sensor to measure a battery current through a battery, a voltage sensor to measure a battery voltage across the battery, and a control circuit. In response to a key-on signal during a first rest period of the battery, the control circuit determines a fixed rest time, a fixed Open Circuit Voltage (OCV) and a fixed State Of Charge (SOC), and determines an integrated current value of the battery current during a cycle period of the battery. In response to a key-off signal during the cycle period, the control circuit starts a second rest period of the battery. The control circuit determines an interest SOC corresponding to an interest OCV, i.e., the battery voltage during the second rest period. The control circuit determines (Continued)

a State Of Heath (SOH) of the battery based on the fixed SOC, the integrated current value and the interest SOC.

16 Claims, 11 Drawing Sheets

(51) Int. Cl.
*G01R 31/388* (2019.01)
*G01R 31/392* (2019.01)
*H01M 10/42* (2006.01)

(52) U.S. Cl.
CPC ......... *H01M 10/425* (2013.01); *H02J 7/0029* (2013.01); *H02J 7/005* (2020.01); *B60L 2240/547* (2013.01); *B60L 2240/549* (2013.01); *B60L 2250/10* (2013.01); *H01M 2010/4271* (2013.01); *H01M 2220/20* (2013.01)

(56) References Cited

U.S. PATENT DOCUMENTS

| | | | |
|---|---|---|---|
| 2004/0162683 A1* | 8/2004 | Verbrugge | G01R 31/367 702/64 |
| 2006/0181245 A1 | 8/2006 | Mizuno et al. | |
| 2009/0070052 A1 | 3/2009 | Taniguchi et al. | |
| 2009/0256524 A1 | 10/2009 | Nukui | |
| 2010/0036626 A1 | 2/2010 | Kang et al. | |
| 2011/0084702 A1 | 4/2011 | Mori | |
| 2013/0268466 A1 | 10/2013 | Baek et al. | |
| 2014/0009123 A1 | 1/2014 | Park et al. | |
| 2014/0232411 A1 | 8/2014 | Vaidya et al. | |
| 2015/0293183 A1 | 10/2015 | Tenmyo et al. | |
| 2018/0313906 A1 | 11/2018 | Takahashi et al. | |

FOREIGN PATENT DOCUMENTS

| | | |
|---|---|---|
| CN | 108802620 A | 11/2018 |
| CN | 109416392 A | 3/2019 |
| EP | 3 410 138 A1 | 12/2018 |
| JP | 2004-138586 A | 5/2004 |
| JP | 2008-145349 A | 6/2008 |
| JP | 2009-080104 A | 4/2009 |
| JP | 6221728 B2 | 11/2017 |
| JP | 2018-185259 A | 11/2018 |
| JP | 2019-060807 A | 4/2019 |
| KR | 10-2011-0084633 A | 7/2011 |
| KR | 10-2012-0120889 A | 11/2012 |
| KR | 10-2013-0113296 A | 10/2013 |
| KR | 10-2016-0103331 A | 9/2016 |
| KR | 10-1777334 B1 | 9/2017 |
| KR | 10-1852664 B1 | 4/2018 |
| KR | 10-1906414 B1 | 10/2018 |
| KR | 10-2019-0028941 A | 3/2019 |
| WO | 2009/158226 A2 | 12/2009 |
| WO | 2015/056312 A1 | 4/2015 |
| WO | 2017/207891 A1 | 12/2017 |

OTHER PUBLICATIONS

International Search Report (with partial English translation) issued in corresponding International Patent Application No. PCT/KR2020/ 018204 dated Mar. 22, 2021.
Office Action dated Apr. 4, 2023, issued in corresponding Japanese Patent Application No. 2022-513889.
Office Action dated Jan. 16, 2025 issued in corresponding Chinese Patent Application No. 202080064408.9. (Note: JP 2008-145349 A, US 2010/0036626 A1, KR 10-2011-0084633 A cited in this CN Office Action were cited in prior IDSs.).

* cited by examiner

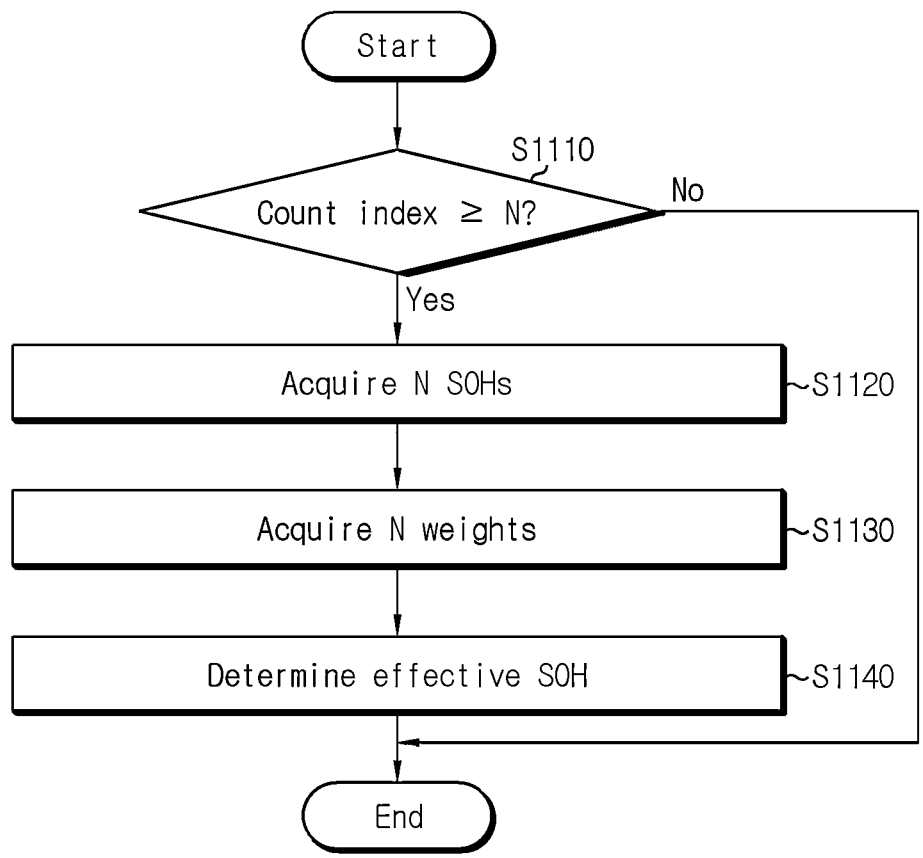

BATTERY MANAGEMENT SYSTEM, BATTERY MANAGEMENT METHOD, BATTERY PACK, AND ELECTRIC VEHICLE

TECHNICAL FIELD

The present disclosure relates to technology that determines a State Of Heath (SOH) of a battery while the battery is resting.

The present application claims the benefit of Korean Patent Application No. 10-2019-0164891 filed on Dec. 11, 2019 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery experiences repeatedly a cycle period in a cycle state and a rest period in a rest state. The cycle state refers to a state in which the charge/discharge of the battery is being performed. The rest state refers to a state in which the charge/discharge of the battery is interrupted (stopped), i.e., a battery current does not flow.

To determine a State Of Heath (SOH) of the battery, a State Of Charge (hereinafter referred to as 'SOC') of the battery is required. In the cycle state, battery current-based methods such as current integration (referred to as 'ampere counting') or Kalman filter are useful in determining the SOC of the battery.

In contrast, in the rest state in which the battery current does not flow, it is more desirable to determine the SOC of the battery based on an OCV-SOC curve which is data defining a correlation between Open Circuit Voltage (hereinafter referred to as 'OCV') and SOC of the battery rather than ampere counting or Kalman filter.

Before a sufficiently long time has passed since the battery shifted from the cycle state to the rest state, the SOC of the battery is constant, while the voltage across the battery is not maintained constantly due to hysteresis generated by a cycle history in the cycle state.

However, since the OCV-SOC curve is completely free of the hysteresis of the battery, the conventional art determines the SOC of the battery using the OCV-SOC curve after a predetermined time (for example, 2 hours) required to stabilize the battery has passed since the battery shifted from the cycle state to the rest state. Accordingly, before the predetermined time has passed since the shift from the cycle state to the rest state, it is impossible to determine the SOC of the battery from the OCV-SOC curve or its accuracy is low.

Additionally, a battery voltage and a battery current corresponding to information necessary to determine the SOC of the battery are measured by a voltage sensor and a current sensor, respectively. However, each of the voltage sensor and the current sensor may have low SOC accuracy due to an offset error (corresponding to a difference between an actual value and a measured value). In particular, the offset error of the current sensor accumulates over time.

DISCLOSURE

Technical Problem

The present disclosure is aimed at accurately determining a State Of Heath (SOH) of a battery at rest by determining a State Of Charge (SOC) change from the ending time of the cycle period of the previous cycle at a predetermined time interval while the battery is resting based on the period of time during which the battery remains at rest.

Additionally, the present disclosure is further aimed at determining a weight for removing an error component of SOH determined at a predetermined time interval while the battery is resting based on a cycle history (for example, a cycle time, an integrated current value) in the cycle period of the previous cycle, a rest time of each of the rest period of the previous cycle and the rest period of the current cycle, and an offset error of a voltage sensor and an offset error of a current sensor while the battery is resting.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure includes a current sensor configured to measure a battery current indicating an electric current flowing through a battery, a voltage sensor configured to measure a battery voltage indicating a voltage across the battery, and a control circuit coupled to the voltage sensor and the current sensor. When the control circuit receives a key-on signal at a first time point during a first rest period of the battery, the control circuit is configured to determine a fixed Open Circuit Voltage (OCV) which is the battery voltage at the first time point and a fixed SOC which is a State Of Charge (SOC) of the battery at the first time point, and start a cycle period of the battery. The control circuit is configured to determine an integrated current value of the battery current during the cycle period. When the control circuit receives a key-off signal at a second time point during the cycle period, the control circuit is configured to start a second rest period of the battery. The control circuit is configured to determine an interest SOC which is a SOC of the battery corresponding to an interest OCV which is the battery voltage during the second rest period. The control circuit is configured to determine a State Of Heath (SOH) of the battery based on the fixed SOC, the integrated current value and the interest SOC.

The control circuit may be further configured to determine a fixed rest time which is a period of time from a start time of the first rest period to the first time point, a cycle time which is a period of time from a start time of the cycle period to the second time point, and an interest rest time which is a length of time that has passed from a start time of the second rest period.

The control circuit may be configured to determine a first error factor based on the cycle time, the integrated current value and a current offset error. The current offset error indicates an offset error of the current sensor. The control circuit may be configured to determine a second error factor and a third error factor based on the fixed OCV, the fixed SOC, the interest OCV, the interest SOC and a voltage offset error. The voltage offset error indicates an offset error of the voltage sensor. The control circuit may be configured to determine a fourth error factor based on the fixed rest time. The control circuit may be configured to determine a fifth error factor based on the interest rest time. The control circuit may be configured to determine a representative error factor based on the first to fifth error factors. The control circuit may be configured to determine a weight indicating reliability of the SOH based on the representative error factor.

The control circuit may be configured to determine the first error factor to be equal to a value of a result of dividing multiplication of the cycle time and the current offset error by the integrated current value.

The control circuit may be configured to determine a SOC change indicating a difference between the fixed SOC and the interest SOC. The control circuit may be configured to determine a first corrected OCV by adding the voltage offset error to the fixed OCV or subtracting the voltage offset error from the fixed OCV. The control circuit may be configured to determine a first corrected SOC corresponding to the first corrected OCV from a predetermined OCV curve. The OCV curve may define a correlation between OCV and SOC when hysteresis of the battery is 0. The control circuit may be configured to determine the second error factor to be equal to a value of a result of dividing a difference between the fixed SOC and the first corrected SOC by the SOC change.

The control circuit may be configured to determine a second corrected OCV by adding the voltage offset error to the interest OCV or subtracting the voltage offset error from the interest OCV. The control circuit may be configured to determine a second corrected SOC corresponding to the second corrected OCV from the OCV curve. The control circuit may be configured to determine the third error factor to be equal to a value of a result of dividing a difference between the interest SOC and the second corrected SOC by the SOC change.

The control circuit may be configured to determine the fourth error factor to be equal to a first error value corresponding to the fixed rest time from a first error curve. The first error curve is data defining a correlation between a rest time and an error value for a first reference SOC which is a SOC of the battery at the start time of the first rest period.

The control circuit may be configured to determine the fifth error factor to be equal to a second error value corresponding to the interest rest time from a second error curve. The second error curve is data defining a correlation between a rest time and an error value for a second reference SOC which is a SOC of the battery at a start time of the second rest period.

The control circuit may be configured to determine the weight using the following Equation:

$$W_{SOH}=M^{-K \times F_{SOH}}$$ <Equation> wherein $W_{SOH}$ denotes the weight, M denotes a predetermined first conversion constant that is greater than 1, K denotes a predetermined second conversion constant that is greater than 0, and $F_{SOH}$ denotes the representative error factor.

The control circuit may be configured to determine an effective SOH which is a weighted average of a predetermined number of SOHs in a recently determined order based on the predetermined number of SOHs and the predetermined number of weights during the second rest period.

A battery pack according to another aspect of the present disclosure includes the battery management system.

An electric vehicle according to still another aspect of the present disclosure includes the battery pack.

A battery management method according to further another aspect of the present disclosure is executable by the battery management system.

Advantageous Effects

According to at least one of the embodiments of the present disclosure, it is possible to accurately determine a State Of Heath (SOH) of a battery at rest by determining a State Of Charge (SOC) change from the ending time of the cycle period of the previous cycle at a predetermined time interval while the battery is resting based on the period of time during which the battery remains at rest.

Additionally, according to at least one of the embodiments of the present disclosure, it is possible to determine a weight for removing an error component of SOH determined at a predetermined time interval while the battery is resting based on a cycle history (for example, a cycle time, an integrated current value) in the cycle period of the previous cycle, a rest time of each of the rest period of the previous cycle and the rest period of the current cycle, an offset error of the voltage sensor and an offset error of the current sensor while the battery is resting.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate preferred embodiments of the present disclosure, and together with the detailed description of the present disclosure described below, serve to provide a further understanding of the technical aspects of the present disclosure, and thus the present disclosure should not be construed as being limited to the drawings.

FIGS. 8 to 11 are flowcharts of each of battery management methods using a battery management system of FIG. 1.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware and software either alone or in combination.

In addition, throughout the specification, it will be further understood that when an element is referred to as being "connected to" another element, it can be directly connected to the other element or intervening elements may be present.

Figure 1:
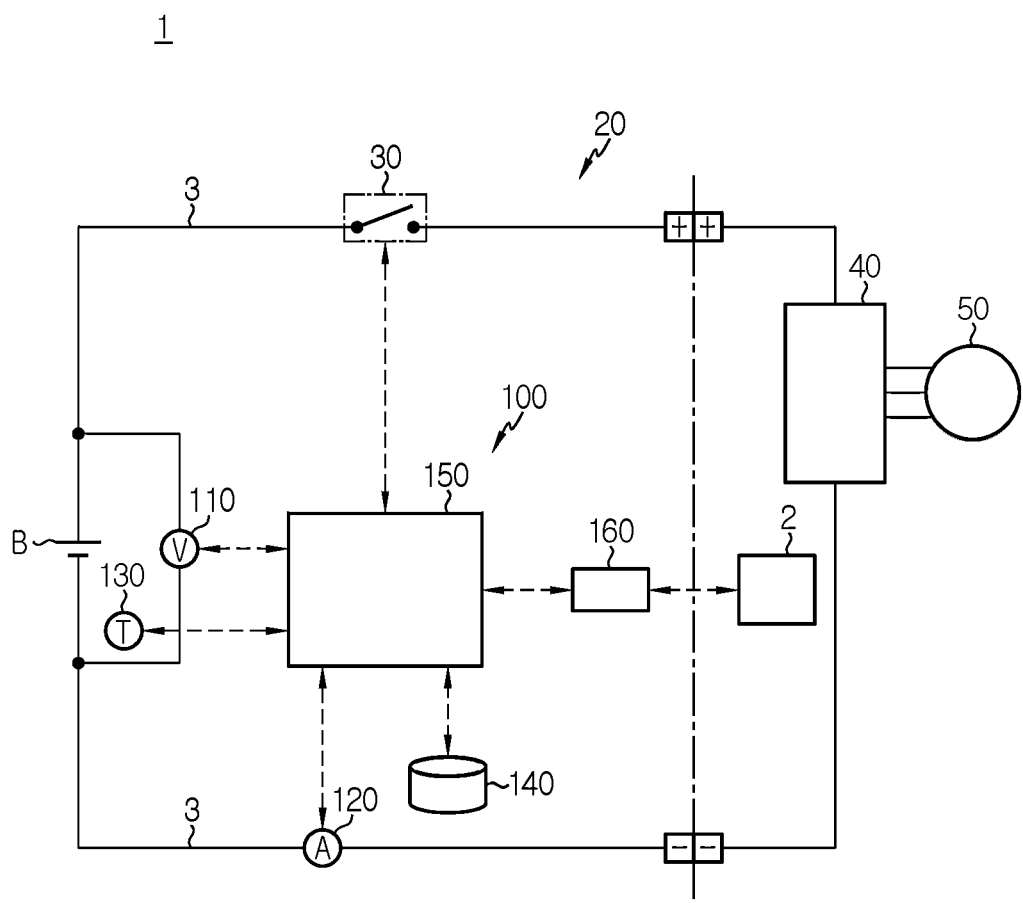
FIG. 1 is a diagram exemplarily showing a configuration of an electric vehicle according to the present disclosure.

FIG. 1 is a diagram exemplarily showing a configuration of an electric vehicle according to the present disclosure.

Referring to FIG. 1, the electric vehicle 1 includes a vehicle controller 2, a battery pack 20, a switch 30, an inverter 40 and an electric motor 50.

The vehicle controller 2 is configured to generate a key-on signal in response to a user's shift of an engine start button (not shown) provided in the electric vehicle 1 to ON-position. The vehicle controller 2 is configured to generate a key-off signal in response to the user's shift of the engine start button to OFF-position.

The switch 30 is installed on a power line 3 for the charge and discharge of the battery pack 20. That is, the switch 30 is connected to a battery B in series through the power line 3. While the switch 30 is in an on state, power may be transferred from any one of the battery pack 20 and the inverter 40 to the other. The switch 30 may include any one of well-known switching devices such as a relay and a Field Effect Transistor (FET) or a combination thereof.

The inverter 40 converts the direct current power supplied from the battery B to alternating current power and supplies to the electric motor 50. The electric motor 50 converts the alternating current power from the inverter 40 to kinetic energy for the electric vehicle 1.

The battery pack 20 includes the battery B and a battery management system 100.

The battery B includes at least one battery cell. The battery cell is not limited to a particular type, and includes any type of rechargeable battery or cell, for example, a lithium ion cell.

The battery management system 100 includes a voltage sensor 110, a current sensor 120, a memory 140 and a control circuit 150. The battery management system 100 may further include at least one of a temperature sensor 130 or a communication circuit 160.

The voltage sensor 110 is provided to be electrically connectable to a positive electrode terminal and a negative electrode terminal of the battery B. The voltage sensor 110 is configured to measure a voltage across the battery B (hereinafter referred to as a 'battery voltage') at a predetermined time interval, and output a signal indicating the measured battery voltage to the control circuit 150.

The current sensor 120 is installed on the power line 3, and is connected to the battery B in series through the power line 3. For example, the current sensor 120 may include a shunt resistor or a hall effect device. The current sensor 120 is configured to measure an electric current flowing through the power line 3 (hereinafter referred to as a 'battery current') at the predetermined time interval, and output a signal indicating the measured battery current to the control circuit 150. The battery current measured during the discharge of the battery B may be referred to as a 'discharge current' and the battery current measured during the charge of the battery B may be referred to as a 'charge current'.

The temperature sensor 130 is positioned at a predetermined distance from the battery B. For example, a thermocouple may be used as the temperature sensor 130. The temperature sensor 130 is configured to measure a temperature of the battery B (hereinafter referred to as a 'battery temperature') at the predetermined time interval and output a signal indicating the measured battery temperature to the control circuit 150.

The memory 140 is configured to store programs and data necessary to perform battery management methods according to the embodiments as described below. The memory 140 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The control circuit 150 is operably coupled to the vehicle controller 2, the switch 30, the voltage sensor 110, the temperature sensor 130, the current sensor 120, the memory 140 and the communication circuit 160. The operably coupled refers to connection to enable unidirectional or bidirectional signal transmission and reception. The control circuit 150 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The communication circuit 160 may be coupled to the vehicle controller 2 to enable communication between. The communication circuit 160 may transmit a message from the vehicle controller 2 to the control circuit 150, and transmit a message from the control circuit 150 to the vehicle controller 2. The communication between the communication circuit 160 and the vehicle controller 2 may use, for example, a wired network such as a local area network (LAN), a controller area network (CAN) and a daisy chain and/or a near-field wireless network such as Bluetooth, Zigbee and WiFi.

The control circuit 150 may determine the SOC of the battery B based on the battery voltage, the battery current and/or the battery temperature. The determination of the SOC during the cycle of the battery B may use well-known methods such as ampere counting and Kalman filter. The determination of the SOC of the battery B at rest will be described in detail below.

Figure 2:
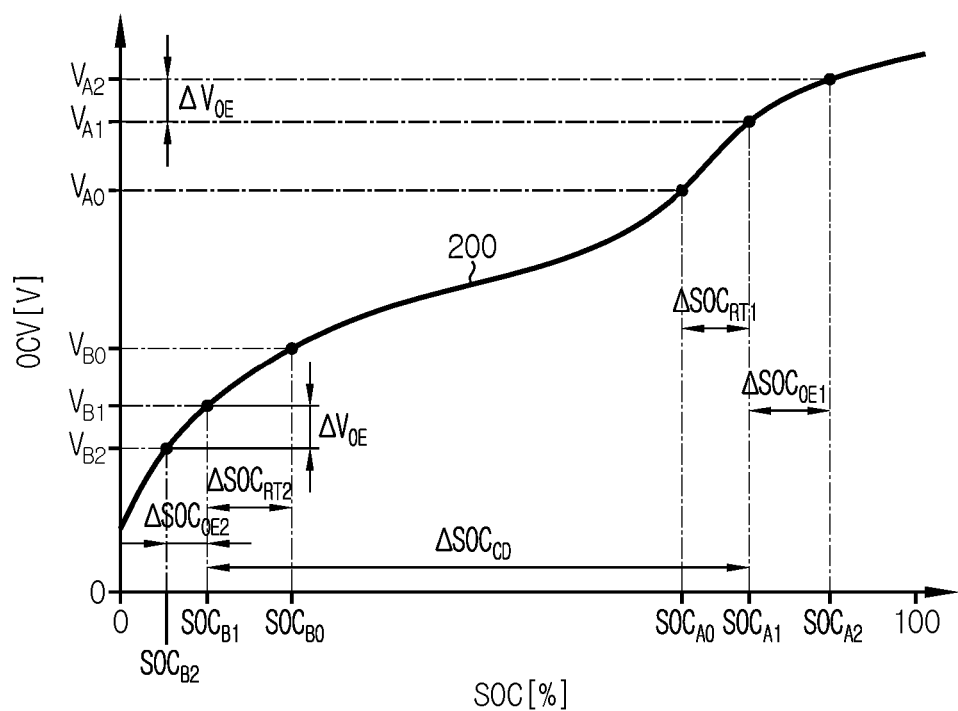
FIG. 2 is a diagram exemplarily showing an Open Circuit Voltage-State Of Charge (OCV-SOC) curve.
Figure 3:
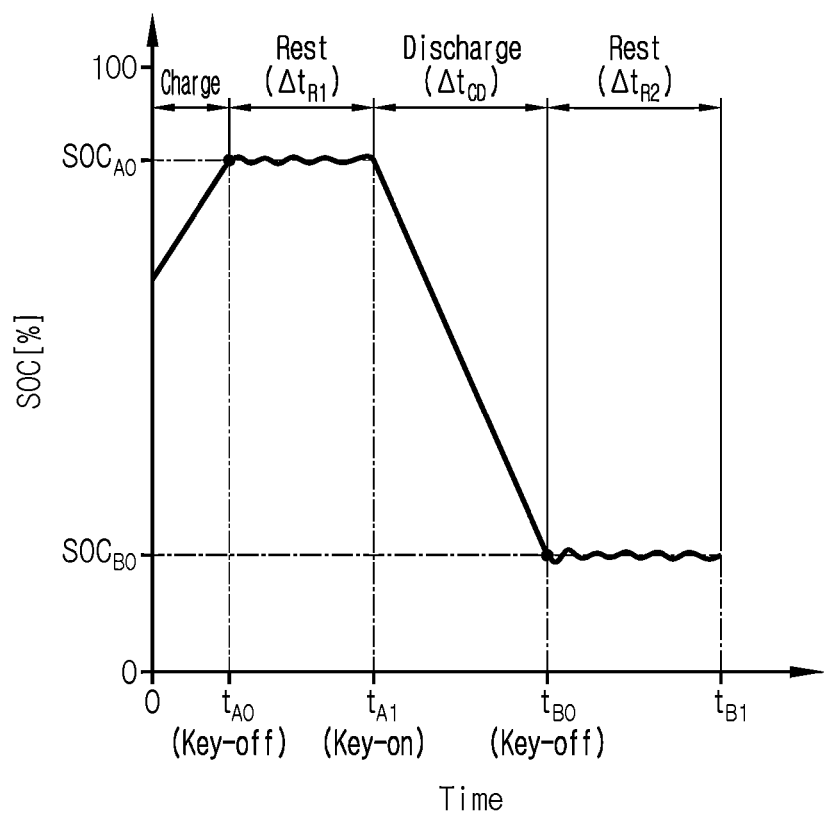
FIG. 3 is a diagram exemplarily showing a change in SOC of a battery of FIG. 1 over the cycle period and the rest period of the battery.
Figure 4:
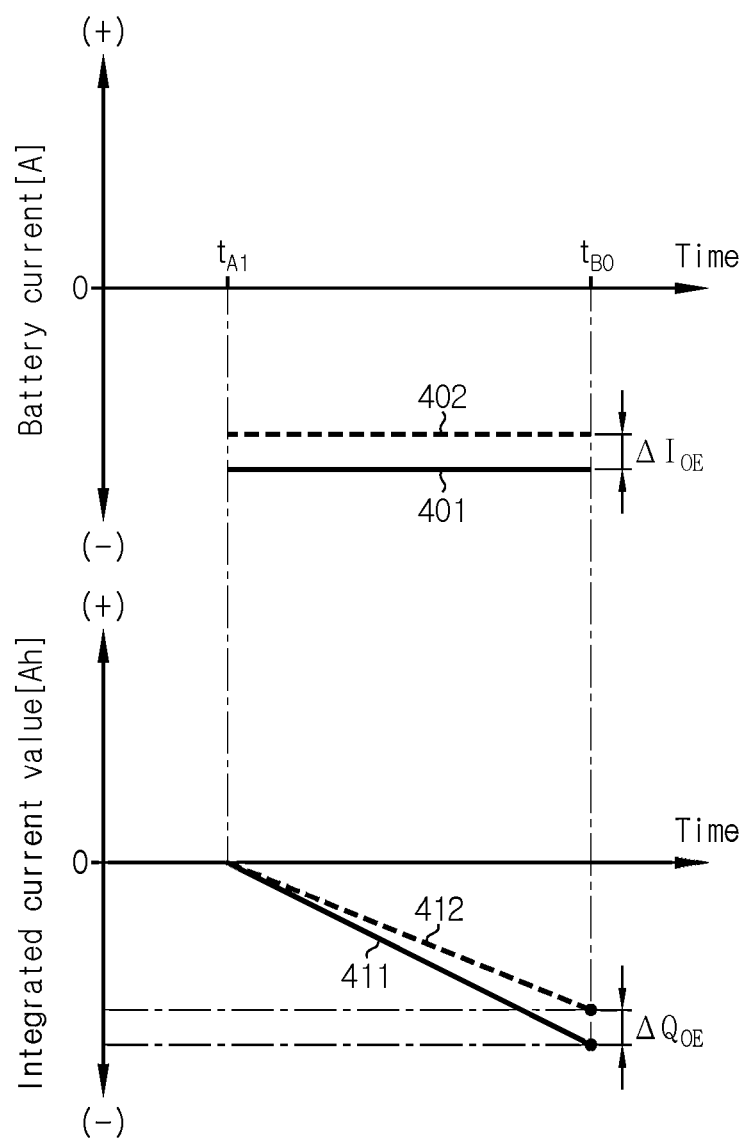
FIG. 4 is a diagram exemplarily showing a change in integrated current value caused by an offset error of a current sensor during a cycle period of a battery of FIG. 1.
Figure 5:
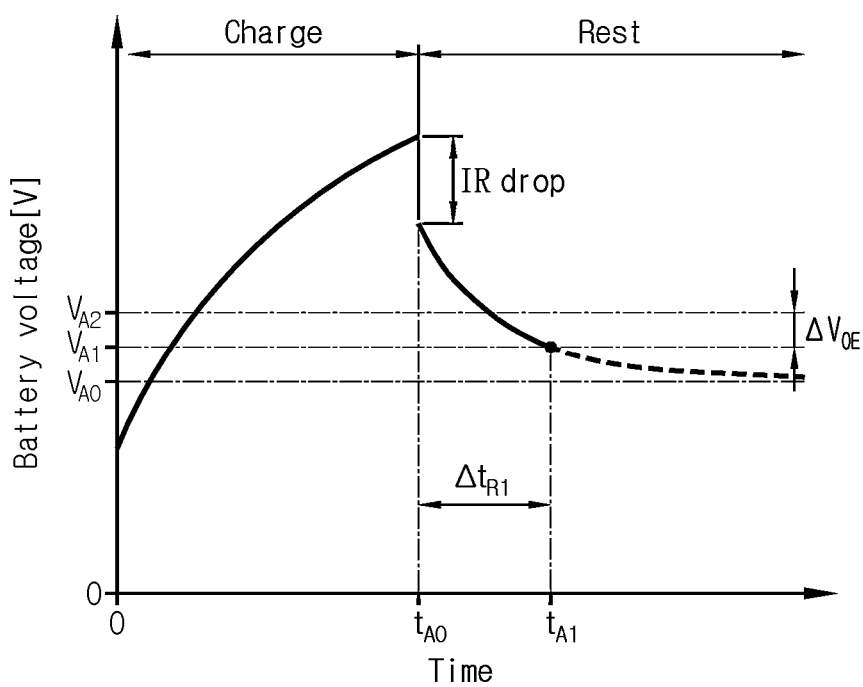
FIG. 5 is a diagram exemplarily showing a change in battery voltage when a battery of FIG. 1 is switched to a rest state during charging.
Figure 6:
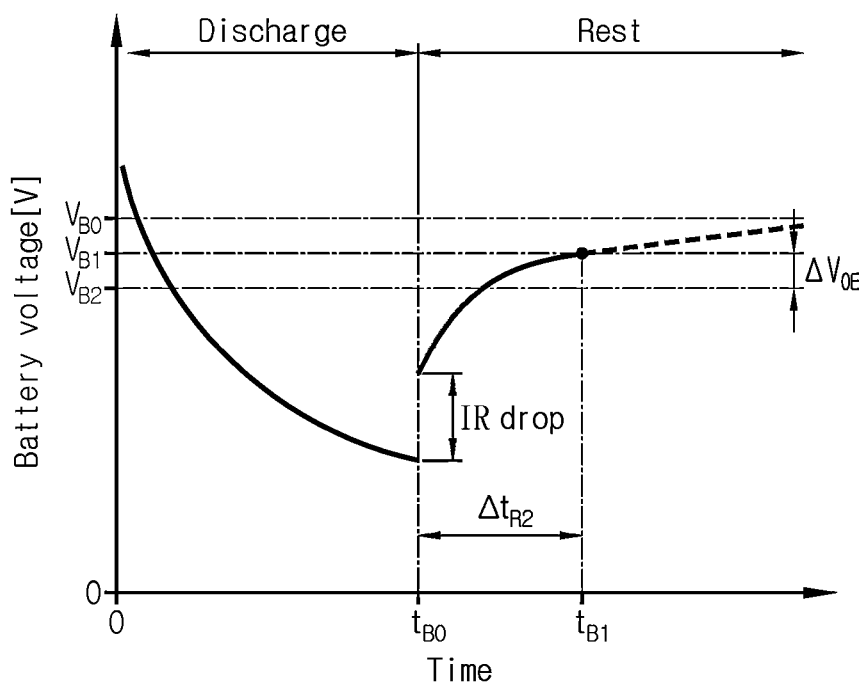
FIG. 6 is a diagram exemplarily showing a change in battery voltage when a battery of FIG. 1 is switched to a rest state during discharging.
Figure 7:
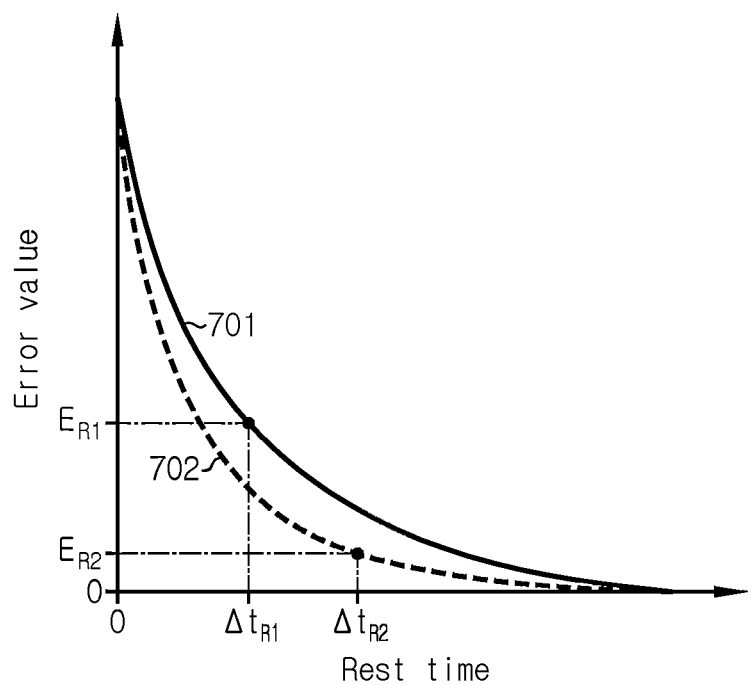
FIG. 7 is a diagram exemplarily showing a correlation between a rest time and an error value.

FIG. 2 is a diagram exemplarily showing an OCV-SOC curve, FIG. 3 is a diagram exemplarily showing a change in SOC of the battery of FIG. 1 over the cycle period and the rest period of the battery, FIG. 4 is a diagram exemplarily showing a change in integrated current value caused by an offset error of the current sensor during the cycle period of the battery of FIG. 1, FIG. 5 is a diagram exemplarily showing a change in battery voltage when the battery of FIG. 1 is switched to a rest state during charging, FIG. 6 is a diagram exemplarily showing a change in battery voltage when the battery of FIG. 1 is switched to a rest state during discharging, and FIG. 7 is a diagram exemplarily showing a correlation between a rest time and an error value.

Referring to FIG. 2, an OCV-SOC curve 200 is a dataset defining a correlation between OCV and SOC completely free of hysteresis of the battery B. For example, the OCV-SOC curve 200 may be data pre-acquired from the result of discharge testing by repeating the constant current discharging over a first test time and resting over a second test time (for example, 5 days) from the full charge to full discharge of another battery (or batteries) having the same specification as the battery B in an environment in which a predetermined reference temperature (for example, 25° C.) is maintained. A method of determining the OCV-SOC curve is not limited to a particular type. The memory 140 may pre-store a plurality of OCV-SOC curves corresponding to a plurality of temperature ranges in a one-to-one relationship.

FIG. 3 shows the time-sequential change in SOC of the battery B while the battery B is shifted from charge to rest state at the time point $t_{A0}$, from rest to discharge state at the time point $t_{A1}$, from discharge to rest state at the time point $t_{B0}$ and kept in the rest state until the time point $t_{B1}$.

The period of time from the time point $t_{A0}$ to the time point $t_{A1}$ is referred to as a 'first rest period', the period of time from the time point $t_{A1}$ at to the time point $t_{B0}$ as a 'cycle period (a discharge period in FIG. 3)', and the period of time from the time point $t_{B0}$ to the time point $t_{B1}$ as a 'second rest period'. The duration of the first rest period $t_{A0} \sim t_{A1}$, a first rest time $\Delta t_{R1}$ is $(t_{A1}-t_{A0})$, the duration of the cycle period $t_{A1} \sim t_{B0}$, a cycle time $\Delta t_{CD}$ is $(t_{B0}-t_{A1})$, and the duration of the second rest period $t_{B0} \sim t_{B1}$, a second rest time $\Delta t_{R2}$ is $(t_{B1}-t_{B0})$. On the basis of the time point $t_{B1}$, the first rest period $t_{A0} \sim t_{A1}$ is already over, and thus the first rest time $\Delta t_{R1}$ is a fixed value. In contrast, on the basis of the time point $t_{B1}$, the second rest period $t_{B0} \sim t_{B1}$ is ongoing, and thus the second rest time $\Delta t_{R2}$ is increasing. Accordingly, the first rest time $\Delta t_{R1}$ is referred to as a 'fixed rest time' and the second rest time $\Delta t_{R2}$ as an 'interest rest time'.

When the control circuit 150 receives a key-off signal during the charge/discharge of the battery B, the control circuit 150 may determine a reference SOC which is the SOC of the battery B when receiving the key-off signal, and start the rest period of the battery B. The start of the rest period refers to a shift from cycle to rest state. For example, in FIGS. 2, 3, 5 and 6, $SOC_{A0}$ indicates the reference SOC at the start time $t_{A0}$ of the first rest period $t_{A0} \sim t_{A1}$, and $SOC_{B0}$ indicates the reference SOC at the start time $t_{B0}$ of the second rest period $t_{B0} \sim t_{B1}$. The control circuit 150 may determine a reference OCV $V_{A0}$ corresponding to the reference SOC $SOC_{A0}$ and a reference OCV $V_{B0}$ corresponding to the reference SOC $SOC_{B0}$ from the OCV-SOC curve 200.

When the control circuit 150 receives a key-on signal while the battery B is resting, the control circuit 150 may determine a fixed OCV and a fixed SOC indicating the battery voltage and the SOC respectively when receiving the key-on signal, and start the cycle period of the battery B. The start of the cycle period refers to a shift from rest to cycle state. For example, in FIG. 2, $V_{A1}$ and $SOC_{A1}$ indicate the fixed OCV and the fixed SOC at the ending start $t_{A1}$ of the first rest period $t_{A0} \sim t_{A1}$ respectively.

The control circuit 150 may determine an interest OCV which is the battery voltage at a predetermined time interval (for example, 1 min) while the battery B is resting. For example, in FIGS. 2 and 6, $V_{B1}$ indicates the interest OCV at the time point $t_{B1}$. The control circuit 150 may determine an interest SOC $SOC_{B1}$ corresponding to the interest OCV $V_{B1}$ from the OCV-SOC curve 200.

The control circuit 150 may determine an integrated current value of the battery current at a predetermined time interval during the charge/discharge of the battery B. Referring to FIG. 4, a curve 401 indicates a change in actual battery current over the cycle period $t_{A1} \sim t_{B0}$. In FIG. 2, since the battery B is discharged over the cycle period $t_{A1} \sim t_{B0}$, FIG. 4 shows the actual battery current in the negative value. A curve 402 indicates a result of reflecting a current offset error $\Delta I_{OE}$ of the current sensor 120 on the curve 401. For example, when the actual battery current is −10 A and $\Delta I_{OE}$ is 0.06 A, the battery current measured by the current sensor 120 is between (−10−0.06) A and (−10+0.06) A.

A curve 411 indicates a change in integrated current value based on the curve 401. A curve 412 indicates a change in integrated current value based on the curve 402. As shown, when a difference as much as the current offset error $\Delta I_{OE}$ is maintained between the curve 401 and the curve 402 over the cycle period $t_{A1} \sim t_{B0}$, a difference as much as $\Delta Q_{OE} = \Delta I_{OE} \times \Delta t_{CD}$ occurs between the curve 411 and the curve 412 at the time point $t_{B0}$.

Referring to FIGS. 2 and 5, the fixed OCV $V_{A1}$ may be a value of a voltage offset error $\Delta V_{OE}$ of the voltage sensor 110 generated in the minus direction for the actual battery voltage $V_{A2}$ at the time point $t_{A1}$. Accordingly, a difference occurs as much as $\Delta SOC_{OE1}$ between the fixed SOCs $SOC_{A1}$ and $SOC_{A2}$.

Referring to FIGS. 2 and 6, the interest OCV $V_{B1}$ may be a value of a voltage offset error $\Delta V_{OE}$ generated in the plus direction for the actual battery voltage $V_{B2}$ at the time point $t_{B1}$. Accordingly, a difference as much as $\Delta SOC_{OE2}$ may occur between the interest SOCs $SOC_{B1}$ and $SOC_{B2}$.

In FIG. 7, a curve 701 indicates a correlation between a rest time and an error value for the reference SOC $SOC_{A0}$ pre-stored in the memory 140. The curve 701 may be data pre-acquired from the result of rest testing by monitoring the rest time and the battery voltage after shifting to the rest state following the constant current discharge of another battery (or batteries) having the same specification as the battery B from 100% SOC until the reference SOC $SOC_{A0}$ in an environment in which the predetermined reference temperature (for example, 25° C.) is maintained. The curve 701 may store each of the reference SOCs of various values in the memory 140.

Referring to FIGS. 2, 5 and 7, as $\Delta t_{R1}$ is longer, $V_{A1}$ is closer to $V_{A0}$, and thus the absolute value of $\Delta SOC_{RT1}$ which is a difference between $SOC_{A0}$ and $SOC_{A1}$ is smaller. The control circuit 150 may determine an error value $E_{R1}$ corresponding to $\Delta t_{R1}$ from the curve 701. The error value $E_{R1}$ may be represented by the following Equation 1.

$$E_{R1} = \frac{|V_{A0} - V_{test\_R1}|}{|V_{A0} - V_{test\_int1}|} \qquad \text{<Equation 1>}$$

In Equation 1, $V_{test\_int1}$ is the battery voltage measured for the first time after the rest state starts by the rest testing, and $V_{test\_R1}$ is the battery voltage measured when the rest state is maintained over $\Delta t_{R1}$ by the rest testing.

A curve 702 indicates a correlation between a rest time and an error value for the reference SOC $SOC_{B0}$ stored in the memory 140. The curve 702 may be data pre-acquired from the result of rest testing by monitoring the rest time and the battery voltage after shifting to the rest state, following the constant current discharge of another battery (or batteries) having the same specification as the battery B, starting from 100% SOC until the reference SOC $SOC_{B0}$ in an environment in which the predetermined reference temperature (for example, 25° C.) is maintained.

Referring to FIGS. 2, 5 and 6, as $\Delta t_{R2}$ is longer, $V_{B1}$ is closer to $V_{B0}$, and thus the absolute value of $\Delta SOC_{RT2}$ which is a difference between $SOC_{B0}$ and $SOC_{B1}$ is smaller. The control circuit 150 may determine an error value $E_{R2}$ corresponding to $\Delta t_{R2}$ from the curve 702. The error value $E_{R2}$ may be represented by the following Equation 2.

$$E_{R2} = \frac{|V_{B0} - V_{test\_R2}|}{|V_{B0} - V_{test\_int2}|} \qquad \text{<Equation 2>}$$

In Equation 2, $V_{test\_int2}$ is the battery voltage measured for the first time after the rest state starts by the rest testing, and $V_{test\_R2}$ is the battery voltage measured when the rest state is maintained over $\Delta t_{R2}$ by the rest testing.

Alternatively, the memory unit 140 may store Equation 1 instead of the curve 701 and Equation 2 instead of the curve 702. In this case, the control circuit 150 may determine the error value $E_{R1}$ by substituting $V_{A1}$ for $V_{test\_R1}$ of Equation 1, and determine the error value $E_{R2}$ by substituting $V_{B1}$ for $V_{test\_R2}$ of Equation 2.

FIGS. 8 to 11 are flowcharts of each of battery management methods using the battery management system of FIG. 1. The control circuit 150 may perform the method of FIG. 8 in response to a key-on signal received from the vehicle controller while the battery B is resting. For convenience of description, the description is made based on the period of time from the time point $t_{A0}$ to the time point $t_{B0}$ shown in FIG. 3.

Referring to FIGS. 1, 2 to 6 and 8, in step S810, the control circuit 150 determines a fixed rest time $\Delta t_{R1}$, a fixed OCV $V_{A1}$ and a fixed SOC $SOC_{A1}$.

In step S820, the control circuit 150 shifts the battery B from the rest state to the cycle state. That is, the cycle period $t_{A1} \sim t_{B0}$ starts.

In step S830, the control circuit 150 determines an integrated current value of the battery current. The integrated current value is a value of the result of summing the battery current measured by the current sensor 120 at a predetermined time interval (for example, 0.1 sec) from the start time of the cycle period $t_{A1} \sim t_{B0}$, and its unit is ampere-hour (Ah).

In step S840, the control circuit 150 determines whether a key-off signal is received from the vehicle controller 2. The step S830 may be repeated at the predetermined time interval (for example, 0.1 sec) until a key-off signal is received.

Figure 8:
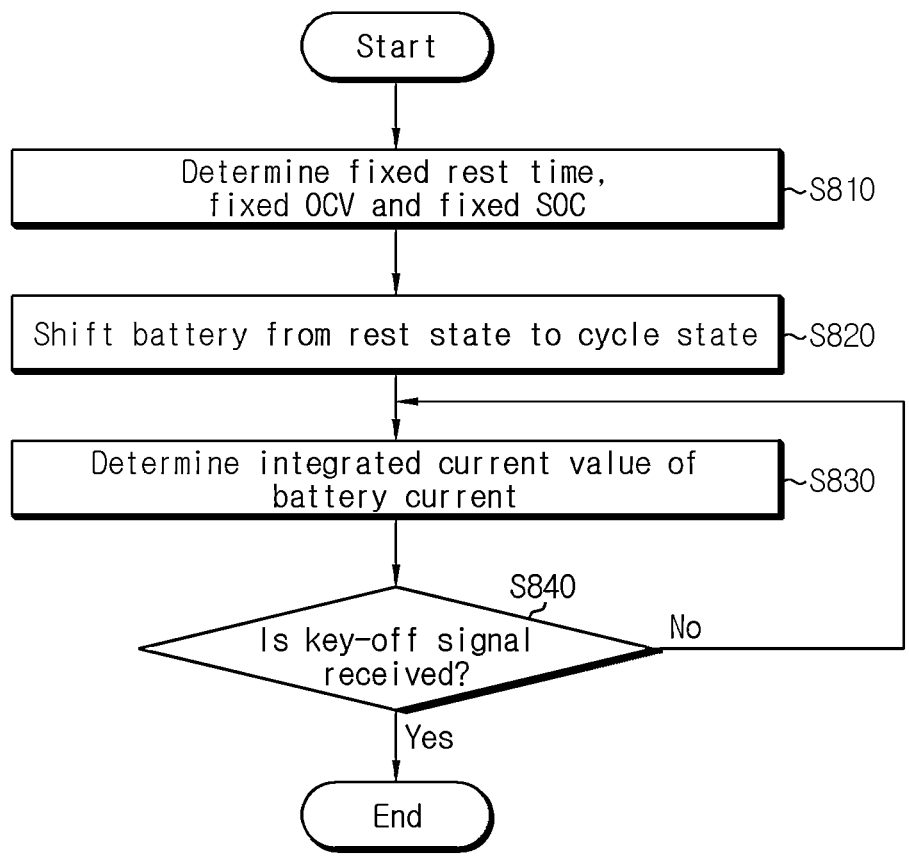
Figure 9:
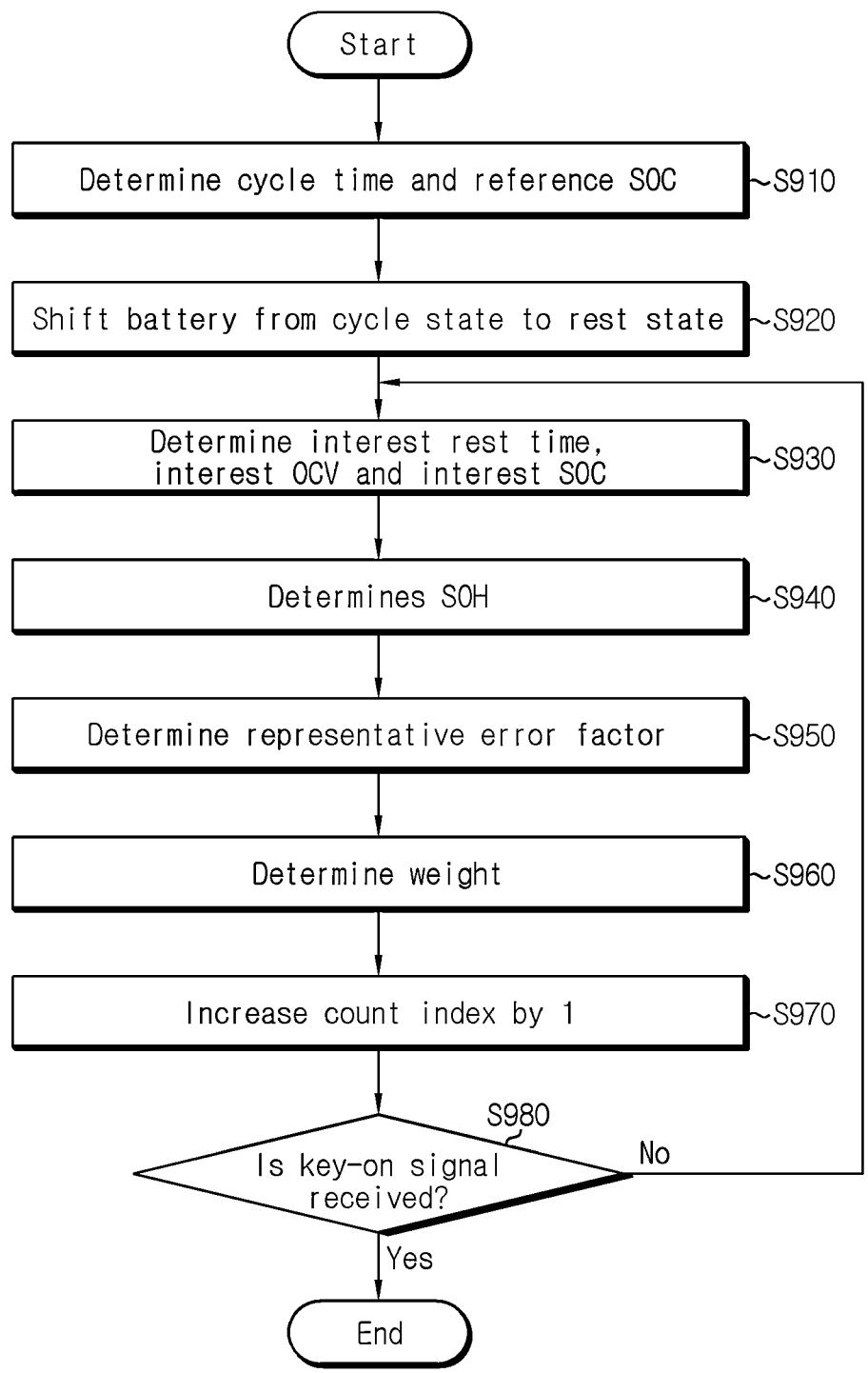

When a key-off signal is received while the method of FIG. 8 is being performed, the method of FIG. 8 may end and the method of FIG. 9 may start. For convenience of description, the description is made based on the period of time from the time point $t_{B0}$.

Referring to FIGS. 1, 2 to 6 and 9, in step S910, the control circuit 150 determines a cycle time $\Delta t_{CD}$ and a reference SOC $SOC_{B0}$.

In step S920, the control circuit 150 shifts the battery B from the cycle state to the rest state. That is, the second rest period $t_{B0} \sim t_{B1}$ starts.

In step S930, the control circuit 150 determines an interest rest time $\Delta t_{R2}$, an interest OCV $V_{B1}$ and an interest SOC $SOC_{B1}$.

In step S940, the control circuit 150 determines a SOH of the battery B. The SOH is information of the battery B associated with a ratio of the current maximum capacity to a predetermined reference capacity, indicated in the range of 0 to 1 or 0 to 100%. The reference capacity refers to the maximum amount of electric charge that can be stored in the pristine battery B (i.e., Beginning of Life). The control circuit 150 may determine the SOH using the following Equation 3.

$$SOH_{R2} = \frac{\Delta Q_{CD}}{Q_{int} \times \Delta SOC_{CD}} = \frac{\Delta Q_{CD}}{Q_{int} \times (SOC_{A1} - SOC_{B1})} \qquad \text{<Equation 3>}$$

In Equation 3, $SOH_{R2}$ denotes SOH when the interest rest time $\Delta t_{R2}$ has passed since the start of the second rest period $t_{B0} \sim t_{B1}$, $Q_{int}$ denotes the reference capacity, $\Delta Q_{CD}$ denotes the integrated current value determined last before the end of FIG. 8, and $\Delta SOC_{CD}$ denotes a SOC change indicating a change between the fixed SOC $SOC_{A1}$ and the interest SOC $SOC_{B1}$. The SOH determined in the step S940 may be referred to as a 'temporary SOH'.

In step S950, the control circuit 150 determines a representative error factor. The representative error factor indicates non-precision of the SOH determined in the step S940. The representative error factor corresponds to a difference between the actual SOH and the SOH determined in the step S940. The determination of the representative error factor will be described in detail with reference to FIG. 10 below.

In step S960, the control circuit 150 determines a weight based on the representative error factor. The weight indicates reliability of the SOH determined in the step S940. As the representative error factor is larger, the reliability of the SOH determined in the step S940 is lower. Accordingly, the representative error factor and the weight have a relationship in which when one of the two reduces, the other increases. For example, the control circuit 150 may determine the weight using the following Equation 4.

$$W_{SOH} = M^{-K \times F_{SOH}} \qquad \text{<Equation 4>}$$

In Equation 4, $W_{SOH}$ denotes the weight, M denotes a predetermined first conversion constant (for example, Euler's number e) that is greater than 1, K denotes a predetermined second conversion constant (for example, 0.8) that is greater than 0, and $F_{SOH}$ denotes the representative error factor.

The values determined by the steps S930 to S960 may be sequentially stored in a predetermined number of buffers within the memory unit 140 according to the first-in first-out method. The buffer is an information storage region.

In step S970, the control circuit 150 increases a count index by 1. The count index indicates the number of repetitions for the steps S930 to S960 during the second rest period $t_{B0}\ t_{B1}$.

In step S980, the control circuit 150 determines whether a key-on signal is received from the vehicle controller. When a key-on signal is received while the method of FIG. 9 is being performed, the method of FIG. 9 may end and the method of FIG. 8 may start. When the method of FIG. 9 ends, the count index may be reset to 0.

The steps S930 to S970 may be repeated at a predetermined time interval (for example, 1 min) until a key-on signal is received.

Figure 10:
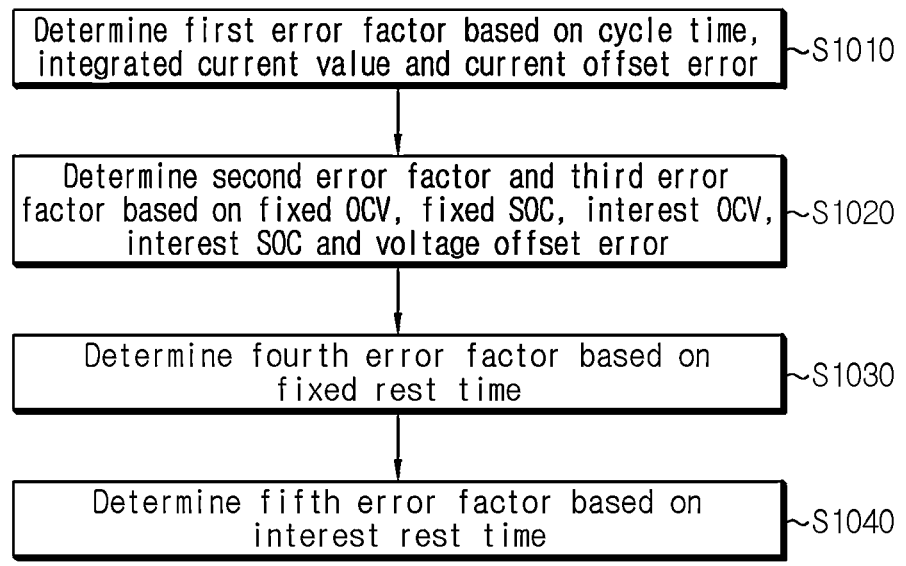

FIG. 10 is a flowchart exemplarily showing the sub-steps of the step S950.

Referring to FIG. 10, in step S1010, the control circuit 150 determines a first error factor based on the cycle time $\Delta t_{CD}$, the integrated current value $\Delta Q_{CD}$ and the current offset error $\Delta I_{OE}$. The first error factor may be equal to a value of the result of dividing the multiplication of the cycle time $\Delta t_{CD}$ and the current offset error $\Delta I_{OE}$ by the integrated current value $\Delta Q_{CD}$. The first error factor corresponds to an error component in the SOH determined in the step S940, occurred due to the current offset error $\Delta I_{OE}$ accumulated over the cycle period $t_{A1} \sim t_{B0}$.

In step S1020, the control circuit 150 determines a second error factor and a third error factor based on the fixed OCV, the fixed SOC, the interest OCV, the interest SOC and the voltage offset error.

The determination of the second error factor will be described. The control circuit 150 determines a first corrected OCV by adding the voltage offset error $\Delta V_{OE}$ to the fixed OCV $V_{A1}$ or subtracting the voltage offset error $\Delta V_{OE}$ from the fixed OCV $V_{A1}$. In this case, the first corrected OCV is equal to $(V_{A1}+\Delta V_{OE})$ or $(V_{a1}-\Delta V_{OE})$. Subsequently, the control circuit 150 determines a first corrected SOC corresponding to the first corrected OCV from the OCV-SOC curve 200. Subsequently, the control circuit 150 may determine the second error factor to be equal to a value of the result of dividing a difference between the fixed SOC $SOC_{A1}$ and the first corrected SOC by the SOC change $\Delta SOC_{CD}$. The second error factor corresponds to an error component in the SOH determined in the step S940, occurred due to the voltage offset error $\Delta V_{OE}$ at the start time $t_{A1}$ of the cycle period $t_{A1} \sim t_{B0}$.

The determination of the third error factor will be described. The control circuit 150 by determines a second corrected OCV by adding the voltage offset error $\Delta V_{OE}$ to the interest OCV $V_{B1}$ or subtracting the voltage offset error $\Delta V_{OE}$ from the interest OCV $V_{B1}$. In this case, the second corrected OCV is equal to $(V_{B1}+\Delta V_{OE})$ or $(V_{B1}-\Delta V_{OE})$. Subsequently, the control circuit 150 determines a second corrected SOC corresponding to the second corrected OCV from the OCV-SOC curve 200. Subsequently, the control circuit 150 may determine the third error factor to be equal to a value of the result of dividing a difference between the interest SOC $SOC_{B1}$ and the second corrected SOC by the SOC change $\Delta SOC_{CD}$. The third error factor corresponds to an error component in the SOH determined in the step S940, occurred due to the voltage offset error $\Delta V_{OE}$ at the time point $t_{B1}$ during the second rest period $t_{B0} \sim t_{B1}$.

In step S1030, the control circuit 150 may determine a fourth error factor based on the fixed rest time $\Delta t_{R1}$. Referring to FIG. 7, the fourth error factor may be equal to the error value $E_{R1}$ according to Equation 1. The fourth error factor corresponds to an error component in the SOH determined in the step S940, occurred due to the fixed rest time $\Delta t_{R1}$ that is not long enough.

In step S1040, the control circuit 150 may determine a fifth error factor based on the interest rest time $\Delta t_{R2}$. Referring to FIG. 7, the fifth error factor may be equal to the error value $E_{R2}$ according to Equation 2. The fifth error factor corresponds to an error component in the SOH determined in the step S940, occurred due to the interest rest time $\Delta t_{R2}$ that is not long enough.

Although FIG. 10 shows that the steps S1010 to S1040 are performed in a sequential order, this is provided by way of example and the steps may be performed in different orders.

The control circuit 150 may determine the representative error factor using the following Equation 5.

$$F_{SOH} = \frac{\sum_{i=1}^{5}(F_i \times w_i)}{\sum_{i=1}^{5} w_i} \qquad \text{<Equation 5>}$$

In Equation 5, $F_{SOH}$ denotes the representative error factor, $F_i$ denotes the $i^{th}$ error factor, and $w_i$ denotes the $i^{th}$ predetermined weight that is greater than 0. For example, each of $w_1$, $w_2$, $w_3$, $w_4$ and $w_5$ may be 1.

The method of FIG. 11 may start each time the step S970 is performed.

In step S1110, the control circuit 150 determines whether the count index is equal to or larger than a predetermined value N (for example, 10). That is, the control circuit 150 determines whether at least N SOHs and at least N weights are sequentially stored in the buffers within the memory unit 140. A value of the step S1110 being "Yes" indicates that the steps S930 to S970 were performed at least N times during the second rest period $t_{B0} \sim t_{B1}$.

In step S1120, the control circuit 150 acquires N SOHs in the recently determined order from the memory unit 140. That is, the control circuit 150 acquires a dataset indicating values of N SOHs starting from the SOH stored last in the memory unit 140.

In step S1130, the control circuit 150 acquires N weights in the recently determined order from the memory unit 140. That is, the control circuit 150 acquires a dataset indicating N weights starting from the weight stored last in the memory unit 140.

In step S1140, the control circuit 150 determines an effective SOH based on the N SOHs and the N weights. The effective SOH may be a weighted average of the N SOHs by the N weights. For example, assume that $SOH_{R2}[1] \sim SOH_{R2}[N]$ are acquired as the N SOHs, and $W_{SOH}[1] \sim W_{SOH}[N]$ are acquired as the N weights. Then, the control circuit 150 may determine the effective SOH using the following Equation 6.

$$SOH_{eff} = \frac{\sum_{i=1}^{N}(SOH_{R2}[i] \times W_{SOH}[i])}{\sum_{i=1}^{N} W_{SOH}[i]} \qquad \text{< Equation 6>}$$

In Equation 6, $SOH_{eff}$ denotes the effective SOH.

When the effective SOH is equal to or less than the threshold (for example, 75%), the control circuit 150 may perform a predetermined protection operation. The protection operation may be, for example, outputting of an alarm message, turning-off of the switch 30, or the like. The alarm message may be transmitted to the vehicle controller 2 through the communication circuit 160.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system, comprising:
   a current sensor configured to measure a battery current indicating an electric current flowing through a battery;
   a voltage sensor configured to measure a battery voltage indicating a voltage across the battery; and
   a control circuit coupled to the voltage sensor and the current sensor,
   wherein the control circuit is configured to:
   receive a key-on signal and a key-off signal,
   in response to the key-on signal at a first time point during a first rest period of the battery, determine a fixed Open Circuit Voltage (OCV) which is the battery voltage at the first time point during the first rest period of the battery and a fixed SOC which is a State Of Charge (SOC) of the battery at the first time point, and start a cycle period of the battery,
   determine an integrated current value of the battery current during the cycle period of the battery,
   start a second rest period of the battery in response to the key-off signal at a second time point during the cycle period,
   determine an interest SOC which is a SOC of the battery corresponding to an interest OCV which is the battery voltage during the second rest period, and
   determine a State Of Heath (SOH) of the battery based on the fixed SOC, the integrated current value, and the interest SOC.

2. The battery management system according to claim 1, wherein the control circuit is further configured to determine a fixed rest time which is a period of time from a start time of the first rest period to the first time point, a cycle time which is a period of time from a start time of the cycle period to the second time point, and an interest rest time which is a length of time that has passed from a start time of the second rest period.

3. The battery management system according to claim 2, wherein the control circuit is further configured to:
   determine a first error factor based on the cycle time, the integrated current value, and a current offset error, wherein the current offset error indicates an offset error of the current sensor,
   determine a second error factor and a third error factor based on the fixed OCV, the fixed SOC, the interest OCV, the interest SOC, and a voltage offset error, wherein the voltage offset error indicates an offset error of the voltage sensor,
   determine a fourth error factor based on the fixed rest time,
   determine a fifth error factor based on the interest rest time,
   determine a representative error factor based on the first to the fifth error factors, and
   determine a weight indicating reliability of the SOH based on the representative error factor.

4. The battery management system according to claim 3, wherein the control circuit is further configured to determine the first error factor to be equal to a value of a result of dividing multiplication of the cycle time and the current offset error by the integrated current value.

5. The battery management system according to claim 3, wherein the control circuit is further configured to:
   determine a SOC change indicating a difference between the fixed SOC and the interest SOC,
   determine a first corrected OCV by adding the voltage offset error to the fixed OCV or subtracting the voltage offset error from the fixed OCV,
   determine a first corrected SOC corresponding to the first corrected OCV from a predetermined OCV curve, wherein the OCV curve defines a correlation between OCV and SOC when hysteresis of the battery is 0, and
   determine the second error factor to be equal to a value of a result of dividing a difference between the fixed SOC and the first corrected SOC by the SOC change.

6. The battery management system according to claim 5, wherein the control circuit is further configured to:
   determine a second corrected OCV by adding the voltage offset error to the interest OCV or subtracting the voltage offset error from the interest OCV,
   determine a second corrected SOC corresponding to the second corrected OCV from the OCV curve, and
   determine the third error factor to be equal to a value of a result of dividing a difference between the interest SOC and the second corrected SOC by the SOC change.

7. The battery management system according to claim 3, wherein the control circuit is further configured to determine the fourth error factor to be equal to a first error value corresponding to the fixed rest time from a first error curve, and
   wherein the first error curve is data defining a correlation between a rest time and an error value for a first reference SOC which is a SOC of the battery at the start time of the first rest period.

8. The battery management system according to claim 7, wherein the control circuit is further configured to determine the fifth error factor to be equal to a second error value corresponding to the interest rest time from a second error curve, and
   wherein the second error curve is data defining a correlation between a rest time and an error value for a second reference SOC which is a SOC of the battery at a start time of the second rest period.

9. The battery management system according to claim 3, wherein the control circuit is further configured to determine the weight using the following Equation:

$$W_{SOH}=M^{-K \times F_{SOH}},$$

wherein $W_{SOH}$ denotes the weight, M denotes a predetermined first conversion constant that is greater than 1, K denotes a predetermined second conversion constant that is greater than 0, and $F_{SOH}$ denotes the representative error factor.

10. The battery management system according to claim 3, wherein the control circuit is further configured to determine an effective SOH which is a weighted average of a predetermined number of SOHs in a recently determined order based on the predetermined number of SOHs and the predetermined number of weights during the second rest period.

11. A battery pack comprising the battery management system according to claim 1 and the battery.

12. An electric vehicle comprising the battery pack according to claim 11.

13. A battery management method that is executable by the battery management system according to claim 1, the method comprising:
- measuring a battery current indicating an electric current flowing through a battery;
- measuring a battery voltage indicating a voltage across the battery;
- receiving a key-on signal;
- in response to the key-on signal at a first time point during a first rest period of the battery, determining a fixed Open Circuit Voltage (OCV) which is the battery voltage at the first time point during the first rest period of the battery and a fixed SOC which is a State Of Charge (SOC) of the battery at the first time point, and starting a cycle period of the battery;
- determining an integrated current value of the battery current during the cycle period;
- receiving a key-off signal;
- starting a second rest period of the battery in response to the key-off signal at a second time point during the cycle period of the battery;
- determining an interest SOC which is a SOC of the battery corresponding to an interest OCV which is the battery voltage during the second rest period; and
- determine a State Of Heath (SOH) of the battery based on the fixed SOC, the integrated current value, and the interest SOC.

14. The battery management system according to claim 10, wherein the control circuit is further configured to perform a predetermined protection operation if the effective SOH is equal to or less than a threshold value.

15. The battery management system according to claim 14, wherein the predetermined protection operation includes at least one of transmitting an alarm message to an external controller and turning off charging or discharging of the battery.

16. The vehicle according to claim 12, further comprising a vehicle controller configured to generate the key-on signal or the key-off signal based on a user input.

* * * * *